(12) United States Patent
Yoshida

(10) Patent No.: US 8,435,630 B2
(45) Date of Patent: May 7, 2013

(54) CUSHIONING PAD FOR HOT PRESS AND METHOD FOR MANUFACTURING THE SAME

(75) Inventor: Akira Yoshida, Kanuma (JP)

(73) Assignee: Yamauchi Corporation, Osaka (JP)

( * ) Notice: Subject to any disclaimer, the term of this patent is extended or adjusted under 35 U.S.C. 154(b) by 280 days.

(21) Appl. No.: 12/515,613

(22) PCT Filed: Nov. 22, 2007

(86) PCT No.: PCT/JP2007/072669
§ 371 (c)(1),
(2), (4) Date: May 20, 2009

(87) PCT Pub. No.: WO2008/065969
PCT Pub. Date: Jun. 5, 2008

(65) Prior Publication Data
US 2010/0316864 A1      Dec. 16, 2010

(30) Foreign Application Priority Data

Nov. 28, 2006   (JP) ................................ 2006-320127

(51) Int. Cl.
*B32B 27/04*   (2006.01)
*C08J 7/04*    (2006.01)

(52) U.S. Cl.
USPC .............. 428/319.3; 428/311.11; 428/311.51; 428/315.5; 428/315.7; 428/306.3; 442/60; 442/63; 427/487; 427/513

(58) Field of Classification Search ............. 428/311.11, 428/315.5, 315.7, 306.6, 311.51, 319.3; 442/60, 442/63; 427/487, 513
See application file for complete search history.

(56) References Cited

U.S. PATENT DOCUMENTS

| | | | | |
|---|---|---|---|---|
| 2,291,764 A | * | 8/1942 | Schultz | 38/140 |
| 2,703,774 A | * | 3/1955 | Morrison | 442/60 |
| 3,414,995 A | * | 12/1968 | Adiletta et al. | 38/140 |
| 3,551,269 A | * | 12/1970 | Marzocchi | 442/60 |
| 3,887,750 A | | 6/1975 | Duckett et al. | |
| 4,093,764 A | | 6/1978 | Duckett et al. | |
| 5,474,810 A | * | 12/1995 | Yen | 427/289 |
| 5,549,968 A | | 8/1996 | Byers et al. | |
| 2007/0027259 A1 | * | 2/2007 | Yoshida | 525/199 |
| 2008/0021134 A1 | | 1/2008 | Yoshida | |

FOREIGN PATENT DOCUMENTS

| | | | |
|---|---|---|---|
| DE | 1918673 A | * | 10/1970 |
| EP | 1 084 821 A2 | | 3/2001 |
| JP | 4197299 A | | 7/1992 |

(Continued)

OTHER PUBLICATIONS

Flat definition from dictionary [retrieved on Mar. 21, 2012]. Retrieved from Internet : <URL: http://www.thefreedictionary.com/flat>.*
Abstract of DE 1918673, Suchomel et al., Oct. 15, 1970.*
Translation of JP 08-148814, Katsunori Ariji, Jun. 7, 1996, 6 pages.*

(Continued)

*Primary Examiner* — Hai Vo
(74) *Attorney, Agent, or Firm* — Ditthavong Mori & Steiner, P.C.

(57) ABSTRACT

A hot press cushioning pad 1 has a fiber-rubber composite material layer formed by a woven fabric and a rubber impregnated in the woven fabric. The warp of the woven fabric is a doubled and twisted yarn, and the weft thereof is a texturized yarn made of glass fibers. The fiber-rubber composite material layer has voids inside.

22 Claims, 3 Drawing Sheets

FOREIGN PATENT DOCUMENTS

| | | | |
|---|---|---|---|
| JP | 4361012 | A | 12/1992 |
| JP | 2002018843 | A | 1/2002 |
| JP | 2003128936 | A | 5/2003 |
| JP | 2006116596 | A | 5/2006 |
| JP | 2007090796 | A | 4/2007 |
| WO | WO 93/18913 | A1 | 9/1993 |
| WO | WO 2004108819 | A1 * | 12/2004 |

OTHER PUBLICATIONS

International Search Report, WO 2008/065969 A1, Jan. 15, 2008, pp. 22-25.

International Search Report for EP 07 83 2398 dated Apr. 12, 2012, pp. 1-6.

* cited by examiner

CUSHIONING PAD FOR HOT PRESS AND METHOD FOR MANUFACTURING THE SAME

TECHNICAL FIELD

The present invention generally relates to a cushioning pad for a hot press and a manufacturing method thereof. More particularly, the present invention relates to a cushioning pad for a hot press, which is used when a target product is press-formed or thermo-compression bonded in a manufacturing process of a precision apparatus component (hereinafter, referred to a "laminated plate" in the present invention) such as a copper-clad laminated plate, a flexible printed circuit board, a printed circuit board such as a multilayer board, an IC card, a liquid crystal display panel, a ceramic laminated plate, and a manufacturing method of the cushioning pad.

BACKGROUND ART

In manufacturing of a laminated plate such as a printed circuit board, a method of inserting a laminated plate material 12 to be pressed between hot platens 13, 13 as heating/pressing means and applying a certain pressure and certain heat to the laminated plate material 12 as shown in FIG. 10 is used in a press forming process and a thermo-compression bonding process. In order to obtain a high precision formed product, it is necessary to uniformly apply heat and a pressure to the whole surface of the laminated plate material 12 in a hot press process. For this purpose, a hot press process is performed with a flat plate-like cushioning pad 11 interposed between each hot platen 13 and the laminated plate material 12.

General characteristics required for the cushioning pad 11 include: a cushioning property for absorbing concaves and convexes of the hot platens 13 and the laminated plate material 12; in-plane uniformity for uniformly transmitting a temperature and a pressure from the hot platens 13 to the laminated plate material 12 in the whole pressing surface; a heat transfer property for efficiently transferring heat from the hot platens 13 to the laminated plate material 12; and heat resistance to a press temperature.

Conventionally, a paper cushioning pad made by laminating about 3 to 20 sheets of kraft paper or linter paper has been commonly used as the hot press cushioning pad 11. The paper cushioning pad is inexpensive and has balanced physical properties in terms of the cushioning property, the in-plane uniformity, and the heat transfer property. The reasons for this are considered as follows: the paper contains an appropriate amount of voids, and this contributes to the cushioning property; constituent fibers of the paper are oriented substantially in the plane direction, and this contributes to the in-plane uniformity; and the paper has a thickness as small as about 0.1 to 1 mm per sheet, and this small thickness contributes to the heat transfer property. However, the paper cushioning pad does not have an ability to restore the voids after pressing, and the constituent fibers are degraded by heat. The paper cushioning pad is therefore disadvantageous in that it cannot be repeatedly used for a plurality of presses.

In view of this, various kinds of hot press cushioning pads such as organic or inorganic fibers bound by a binder, a rubber, a nonwoven fabric, a woven fabric, and a lamination of these materials have been proposed as hot press cushioning pads capable of repeated use.

Japanese Unexamined Patent Publication No. H04-361012 discloses a hot press cushioning pad produced by alternately laminating webs and base fabrics, needling the lamination, impregnating the resultant needle-punched nonwoven fabric with a heat-resistant resin, and heating and pressing the resin-impregnated needle-punched nonwoven fabric to a density of 0.6 g/cm$^3$ to 0.9 g/cm$^3$. A meta-aromatic polyamide fiber, hemp (ramie), and a polyester are used as a material of the nonwoven fabric, and a silicone rubber, an ethylene-acrylic rubber, and an EPDM are used as the heat-resistant resin. According to the structure of Japanese Unexamined Patent Publication No. H04-361012, a cushioning property which is stable over time even after repeated use in a plurality of presses can be obtained by defining the density to a specific range.

In such a needle-punched nonwoven fabric as used in Japanese Unexamined Patent Publication No. H04-361012, however, fibers are mechanically tangled by needling the webs. Therefore, the density of the webs themselves is not uniform. The hot press cushioning pad using the needle-punched nonwoven fabric therefore has a disadvantage of poor in-plane uniformity for uniformly transmitting a temperature and a pressure. Moreover, in the needle-punched nonwoven fabric, it is necessary to tangle the fibers by needling the webs in the thickness direction. Accordingly, the thickness of the hot press cushioning pad cannot be reduced very much. For example, the hot press cushioning pad described in the above publication has a final thickness of about 3.3 mm to about 3.7 mm, and therefore, has a disadvantage of a poor heat transfer property.

Moreover, in the hot press cushioning pad described in the above publication, the needle-punched nonwoven fabric is heated and pressed after impregnated with a heat-resistant resin. Therefore, the void ratio becomes small and the cushioning property is not so good. In other words, the hot press cushioning pad described in the above publication sacrifices the in-plane uniformity, the heat transfer property, and the cushioning property in order to make the physical properties stable over time even after repeated use.

Japanese Unexamined Patent Publication No. H04-197299 discloses a press cushioning pad formed by 3 to 5-ply multi-layered woven fabrics using a heat-resistant spun yarn, and a press cushioning pad formed by impregnating the multilayered woven fabrics with a heat-resistant resin solution. In general, woven fabrics have an advantage of an accurate area weight, while having a disadvantage of a poor cushioning property. The cushioning pad described in Japanese Unexamined Patent Publication No. H04-197299, however, has a multilayered woven fabric structure to obtain a cushioning property. However, woven fabrics essentially have a poorer cushioning property than that of cotton-like nonwoven fabrics, and no significant improvement in cushioning property can be expected even if the multilayered woven fabric structure is provided. Moreover, if organic fibers are used as a material of the woven fabrics, dimensions change after repeated use, and sufficient stability is not obtained. When inorganic fibers such as glass fibers are used, on the other hand, excellent shape stability is obtained, but the fibers are bent or broken by a press, whereby the cushioning pad cannot be used repeatedly.

DISCLOSURE OF THE INVENTION

It is an object of the present invention to provide a hot press cushioning pad which has excellent characteristics in each of a cushioning property, in-plane uniformity, and a heat transfer property, is capable of maintaining the excellent cushioning property even after repeated use in a plurality of hot presses, and has excellent dimension stability and excellent durability, and a manufacturing method of the hot press cushioning pad.

A hot press cushioning pad according to the present invention includes a fiber-rubber composite material layer formed by a woven fabric and a rubber impregnated in the woven fabric. The woven fabric uses a texturized yarn made of glass fibers as at least one of warp and weft. The fiber-rubber composite material layer has voids inside.

The texturized yarn is a yarn having a large occupied area, in which short fibers forming a glass yarn are not in parallel with each other but are tangled, and are arranged in a disordered state. In other words, the texturized yarn is bulky like a wool yarn. Therefore, unlike a normal woven fabric, the woven fabric using the texturized yarn has a large amount of voids inside.

According to the hot press cushioning pad of the present invention, the rubber impregnated in the woven fabric moderately enters the voids of the texturized yarn and the voids of the weave texture. Since the rubber does not completely block the voids, and a certain level of a void property is maintained, an excellent cushioning property is obtained. Moreover, since the hot press cushioning pad is in the form of a woven fabric formed by weaving the texturized yarn, the area weight is more accurate than that of a nonwoven fabric, and excellent in-plane uniformity is obtained. Moreover, since the hot press cushioning pad is in the form of a woven fabric, the thickness of the hot press cushioning pad can be made smaller than that of a nonwoven fabric, whereby an excellent heat transfer property can be obtained.

The glass fibers have heat resistance, and hardly change in dimensions when heated. Therefore, the hot press cushioning pad has excellent dimension stability even after repeated use in a plurality of heat presses. The rubber impregnated in the woven fabric protects the glass fibers and bonds the connection points of the fibers. Accordingly, the glass fibers are not broken even after repeated use in a plurality of heat presses, and the cushioning pad of the present invention has excellent durability. Moreover, since the connection points of the fibers are bonded by the rubber, the bonded connection points together with the rubber elasticity can prevent so-called wear-out of the woven fabric. The voids inside the cushioning pad can be maintained even after repeated use in a plurality of heat presses, whereby the excellent cushioning property can be maintained.

Note that the types of the "texturized yarn" used in the specification include a bulked yarn, a staple yarn, and a sliver yarn, and the like. The bulked yarn is a yarn texturized by air jet processing or the like. The staple yarn is a yarn produced by spinning cotton-like glass short fibers into a thread. The sliver yarn is a yarn produced by twisting untwisted bulky short fibers (slivers).

Preferably, a volume ratio of the rubber to fibers of the woven fabric in the fiber-rubber composite material layer is 5 to 50%. When the volume ratio of the rubber to the constituent fibers of the woven fabric is in this range, the rubber impregnated in the woven fiber moderately enters the voids of the textured yarn and the voids of the weave texture. Moreover, the rubber does not completely block the voids, and a certain level of the void property is maintained. If the volume ratio of the rubber is less than 5%, the hot press cushioning pad may wear out after repeated use in a plurality of heat presses, and the cushioning property may degrade. Moreover, the glass fibers may be broken, and the durability may be lost. If the volume ratio of the rubber to the constituent fibers of the woven fabric is higher than 50%, on the other hand, the rubber excessively enters the voids of the textured yarn, whereby the void ratio is reduced. As a result, the cushioning property of the cushioning pad itself may degrade. More preferably, the volume ratio of the rubber to the constituent fibers of the woven fabric is 5 to 35%.

In order for the hot press cushioning pad to maintain its excellent cushioning property, a void ratio of the fiber-rubber composite material layer is preferably 20 to 65%. A more preferable range of the void ratio is 25 to 65%.

The texturized yarn may be used as one of the warp and the weft of the woven fabric, or may be used as both the warp and the weft of the woven fabric. In the case where one of the warp and the weft is the textured yarn, the other can be formed by a normal single yarn or a doubled and twisted yarn. The layer structure of the woven fabric may be either a single weave structure or a multiple weave structure. Weaving methods include plain weave, twilled weave, and other kinds of weave. However, the present invention is not limited to a specific weaving method. The accuracy of the area weight, and the void property of the woven fabric can be adjusted by appropriately selecting a yarn count, a weave density, a weaving method, and the like.

Preferably, the texturized yarn is a bulked yarn. The bulked yarn is a kind of the texturized yarn, and is a processed yarn which is made bulky like a wool yarn by opening fibers of a single yarn or bulking a doubled and twisted yarn by air jet processing. The woven fabric using the bulky yarn has a high void ratio, and can be moderately impregnated with the rubber. The fabric-rubber composite material layer formed by the woven fabric using the bulky yarn of glass fibers, the rubber impregnated in the woven fabric, and the voids inside have excellent characteristics in each of the cushioning property, the in-plane uniformity, and the heat transfer property. The fabric-rubber composite material layer can maintain its excellent cushioning property even after repeated use in a plurality of heat presses, and has excellent dimension stability and excellent durability. Therefore, the fiber-rubber composite material layer can be preferably used as a hot press cushioning pad.

Preferably, the rubber which is impregnated in the woven fabric using the textured yarn of glass fibers is one kind of a rubber or a mixture of at least two kinds of rubbers selected from the group consisting of a fluoro rubber, an EPM, an EPDM, a hydrogenated nitrile rubber, a silicone rubber, an acrylic rubber, and a butyl rubber. These rubbers have excellent heat resistance. Among others, the fluoro rubber is the most preferable because it has especially good physical properties such as heat resistance and strength.

The hot press cushioning pad according to the present invention may be formed by integrally laminating at least one layer of the fiber-rubber composite material layer and at least one layer of at least one kind of material selected from a woven fabric, a nonwoven fabric, paper, a film, a foil, a sheet, and a plate. It should be understood that the hot press cushioning pad may be formed only by the fiber-rubber composite material layer.

A method for manufacturing a hot press cushioning pad according to the present invention includes the steps of: preparing a woven fabric using a texturized yarn made of glass fibers as at least one of warp and weft; penetrating the woven fabric with an unvulcanized rubber solution; drying the unvulcanized rubber solution penetrated in the woven fabric; and vulcanizing the dried unvulcanized rubber.

By drying the unvulcanized rubber penetrated in the woven fabric including the texturized yarn, a solvent is vaporized, whereby voids appear inside the fiber-rubber composite material layer. The vulcanizing step may be performed either in a non-compressed state or in a compressed state. By this method, a fiber-rubber composite material layer can be obtained in which the rubber impregnated in the woven fabric moderately enters the voids of the texturized yarn and the voids of the weave texture, but the rubber does not completely block the voids, and a certain level of the void property is maintained. This fiber-rubber composite material layer may be preferably used as a hot press cushioning pad by itself or by integral lamination with another material.

In manufacturing of a hot press cushioning pad having a laminated structure of the fiber-rubber composite material and another material, a vulcanized fiber-rubber composite material and another material may be bonded together. Alternatively, an unvulcanized fiber-rubber composite material and another material may be laminated and then press-vulcanized in the laminated state, so that they can be integrated simultaneously with vulcanization.

BEST MODE FOR CARRYING OUT THE INVENTION

Hereinafter, an embodiment of the present invention will be described with reference to the accompanying drawings.

FIG. 1 and FIGS. 4 through 8 are cross-sectional views showing an embodiment of a hot press cushioning pad according to the present invention.

Figure 1:
FIG. 1 is a cross-sectional view of an embodiment of a hot press cushioning pad according to the present invention.

A hot press cushioning pad 1 of FIG. 1 is a monolayer of a fiber-rubber composite material made of a woven fabric and a rubber impregnated in the woven fabric. A texturized yarn made of glass fibers is used for at least one of the warp and the weft of the woven fabric. The fiber-rubber composite material layer has voids inside. The fiber-rubber composite material layer has a thickness of about 0.5 mm to about 5 mm, and is in the form of a sheet.

Figure 2:
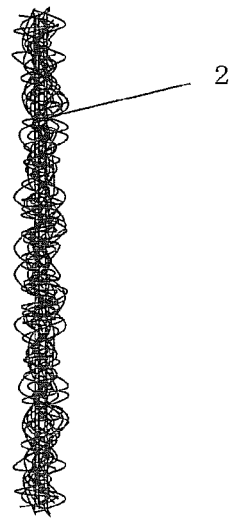
FIG. 2 is an illustration of a texturized yarn.

FIG. 2 shows a bulked yarn 2 of glass fibers which is preferable as the texturized yarn which is a constituent material of the hot press cushioning pad. The bulked yarn 2 is a processed yarn which is made bulky like a wool yarn by opening fibers of a single yarn or bulking a doubled and twisted yarn by air jet processing. Since the bulked yarn 2 contains a large volume of voids in the yarn itself, the bulked yarn 2 can be moderately impregnated with the rubber.

Figure 3:
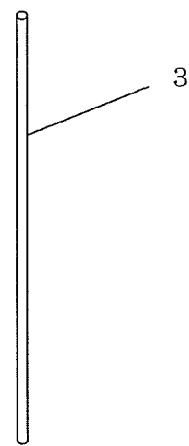
FIG. 3 is an illustration of a normal glass fiber.

FIG. 3 is a single yarn or a doubled and twisted yarn as a normal glass fiber yarn 3. The woven fabric in the fiber-rubber composite material yarn layer may be produced either by using the bulked yarn 2 as one of the warp and the weft and using the normal glass fiber yarn 3 as the other, or by using the bulked yarn 2 as both the warp and the weft. A single-weave woven fabric or a multiple-weave woven fabric is used as the woven fabric. For example, A305, A330, A400, A415, A450, A500, T330, T540, T790, T860, and T900 made by Unitika Ltd., KS4010, KS4155, and KS4325 made by Nitto Boseki Co., Ltd., and the like are commercially available as woven fabrics using bulked yarns of glass fibers.

In an embodiment of the present invention, the doubled and twisted yarn 3 is used as the warp of the woven fabric, and the texturized yarn (e.g., bulked yarn) 2 is used as the weft of the woven fabric. The rubber has moderately entered the voids in the texturized yarn 2 and the voids in the weave texture. The fiber-rubber composite material layer 1 has a multiplicity of voids in the rubber which has penetrated the texturized yarns and the weave texture.

The fiber-rubber composite material layer 1 has a woven fabric and a rubber impregnated in the woven fabric. Preferably, the rubber is impregnated in the voids of the entire woven fabric so that the volume ratio of the rubber to the constituent fibers of the woven fabric becomes 5% to 50%. More preferably, the volume ratio of the rubber is 5 to 35%. In the fiber-rubber composite material layer 1, the voids in the woven fabric are not completely blocked by the rubber, and the fiber-rubber composite material layer 1 has a certain level of the void property. The fiber-rubber composite material layer preferably has a void ratio of 20 to 65%, and more preferably, 25 to 65%.

Preferably, the rubber which is impregnated in the woven fabric is one kind of a rubber or a mixture of two or more kinds of rubbers selected from the group consisting of a fluoro rubber, an EPM, an EPDM, a hydrogenated nitrile rubber, a silicone rubber, an acrylic rubber, and a butyl rubber.

The hot press cushioning pads of FIGS. 4 to 8 have an integrally laminated structure of the fiber-rubber composite material layer 1 shown in FIG. 1 and another material.

Figure 4:
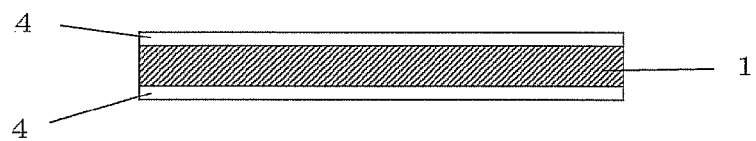
FIG. 4 is a cross-sectional view showing another example of the hot press cushioning pad of the present invention.

The hot press cushioning pad of FIG. 4 is formed by integrally laminating a surface layer 4 on both front and back surfaces of the fiber-rubber composite material layer 1. The surface layers 4 are provided in order to give mainly a mold-releasing property to the hot press cushioning pad. A synthetic resin film, a material produced by applying a mold-releasing resin to the front surface of a base material made of a woven fabric, and the like may be used as a material of the surface layers 4.

Figure 5:
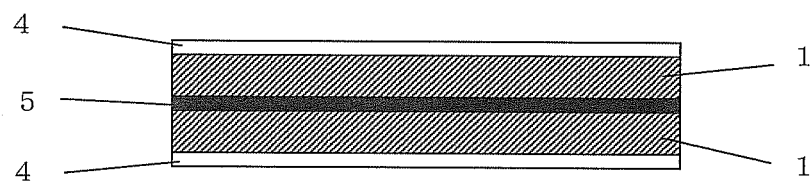
FIG. 5 is a cross-sectional view showing still another example of the hot press cushioning pad of the present invention.

The hot press cushioning pad of FIG. 5 is formed by laminating two fiber-rubber composite material layers 1 with an adhesive layer 5 interposed therebetween. A surface layer 4 is integrally laminated on both upper and lower surface of the lamination. For example, a material formed by applying a heat-resistant rubber adhesive to both upper and lower surfaces of a base material made of a woven fabric may be used as the adhesive layer 5.

Figure 6:
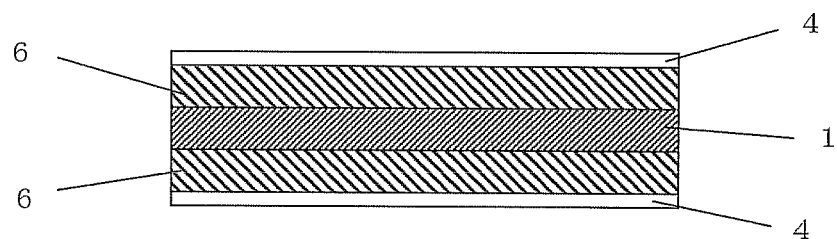
FIG. 6 is a cross-sectional view showing yet another example of the hot press cushioning pad of the present invention.

The hot press cushioning pad of FIG. 6 is formed by laminating a rubber layer 6 on both upper and lower surfaces of the fiber-rubber composite material layer 1, and integrally laminating a surface layer 4 on both upper and lower surfaces of the lamination. Heat-resistant rubbers such as a fluoro rubber, an EPM, an EPDM, a hydrogenated nitrile rubber, a silicone rubber, an acrylic rubber, and a butyl rubber can be used as the rubber layer 6. Among others, the fluoro rubber is preferable in view of heat resistance, strength, and the like.

Figure 7:
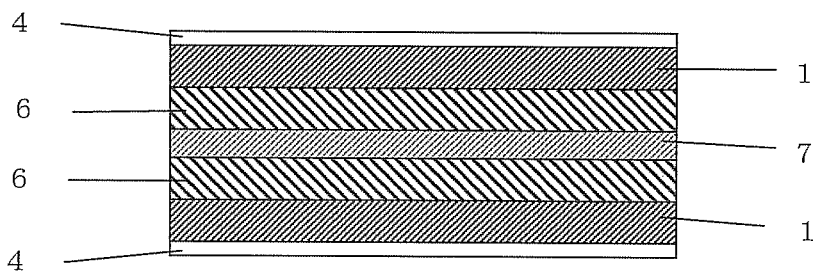
FIG. 7 is a cross-sectional view showing a further example of the hot press cushioning pad of the present invention.

The hot press cushioning pad of FIG. 7 is formed by a reinforcing cloth layer 7 located in the middle in the thickness direction, rubber layers 6 located on both upper and lower surfaces of the reinforcing cloth layer 7, fiber-rubber composite material layers 1 located on both upper and lower surfaces of the rubber layers 6, and surface layers 4 located on both uppermost and lowermost surfaces of the lamination.

Figure 8:
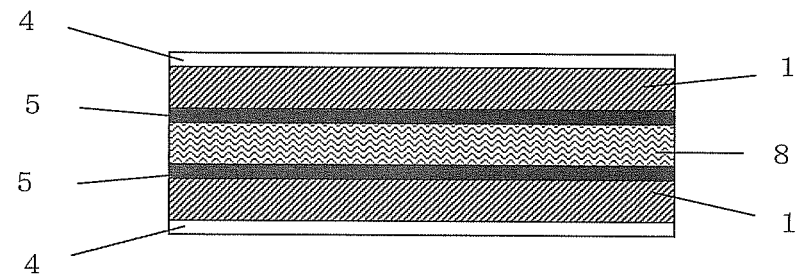
FIG. 8 is a cross-sectional view showing a still further example of the hot press cushioning pad of the present invention.

The hot press cushioning pad of FIG. 8 is formed by a nonwoven fabric layer 8 located in the middle in the thickness direction, adhesive layers 5 located on both upper and lower surfaces of the nonwoven fabric layer 8, fiber-rubber composite material layers 1 located on top and bottom of the adhesive layers 5, and surface layers 4 located on both uppermost and lowermost surfaces of the lamination. A needle-punched nonwoven fabric made of heat-resistant fibers such as an aromatic polyamide or a polybenzazole can be used as the nonwoven fabric layer 8.

A manufacturing method of the fiber-rubber composite material 1 includes the steps of: preparing a woven fabric using a texturized yarn of glass fibers as at least one of the warp and the weft; penetrating the woven fabric with an unvulcanized rubber solution; drying the unvulcanized rubber solution penetrated in the woven fabric; and vulcanizing the dried vulcanize rubber.

The unvulcanized rubber solution can be prepared by dissolving an unvulcanized rubber in a solvent such as ethyl acetate, n-butyl acetate, or methyl ethyl ketone so that the solid concentration becomes about 10% to about 50%.

The woven fabric using the texturized yarn of glass fibers is sufficiently penetrated with the unvulcanized rubber solution by coating or impregnating the woven fabric with the unvulcanized rubber solution. If necessary, a glass paper penetrated with the unvulcanized rubber solution is squeezed with a roll or the like to adjust the impregnated amount of the unvulcanized rubber solution.

The woven fabric penetrated with the unvulcanized rubber solution is then dried to remove the solvent of the rubber. At this time, voids appear inside the woven fabric impregnated with the unvulcanized rubber.

The woven fabric penetrated with the unvulcanized rubber is then heated at a temperature of 160° C. to 250° C. for 15 minutes to 10 hours to vulcanize the rubber, whereby the fiber-rubber composite material layer 1 can be obtained. The rubber can be vulcanized either in a non-compressed state or in a compressed state.

In manufacturing of a hot press cushioning pad having a laminated structure of the fiber-rubber composite material layer 1 and another material as shown in FIGS. 4 through 8, a vulcanized fiber-rubber composite material and another material may be bonded together. Alternatively, an unvulcanized fiber-rubber composite material and another material may be laminated and then press-vulcanized in the laminated state, so that they can be integrated simultaneously with vulcanization.

Figure 10:
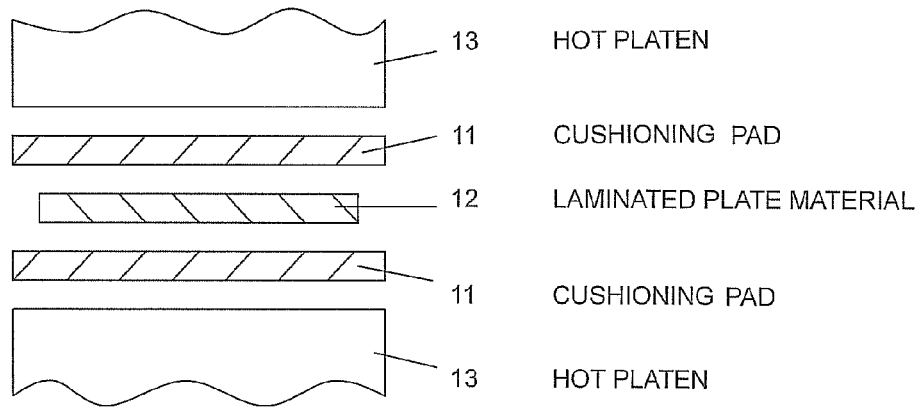
FIG. 10 is an illustration of a hot press.

In manufacturing of a laminated plate such as a printed circuit board, the hot press cushioning pad of the present invention can be used in press forming and thermo-compression bonding by the method as shown in FIG. 10, as in the conventional example. In other words, by performing a heat press with the hot press cushioning pad 11 interposed between each hot platen 13 and the laminated plate material 12, the heat and the pressure can be uniformly applied to the whole surface of the laminated plate material 12 to be pressed.

EXAMPLES

Samples 1 to 9

Glass woven fabrics "T860" using a bulked yarn (made by Unitika Ltd.) was used as woven fabrics. The weft of these woven fabrics is a bulked yarn formed by texturizing a 305-tex doubled and twisted yarn of 3,200 E-glass fibers (fiber diameter: 6 μm), and the warp thereof is a 135-tex non-texturized doubled and twisted yarn of 1,600 E-glass fibers (fiber diameter: 6 μm). The woven fabrics were formed by weaving the warp and weft yarns in double weave. Each woven fabric had a weight of 850 g/m², a thickness of 1.02 mm, and a void ratio of 67%. Unvulcanized fluoro rubber solutions were prepared by dissolving an unvulcanized fluoro rubber at a predetermined concentration in a solvent prepared by mixing butyl acetate and methyl ethyl ketone at a mass ratio of 1:1. The solid concentration of each unvulcanized fluoro rubber solution is as shown in Table 1. After immersed in the respective unvulcanized fluoro rubber solution, each glass woven fabric was squeezed with two rolls. Each glass woven fabric penetrated with the respective unvulcanized fluoro rubber solution was then sufficiently dried to remove the solvent.

A surface layer material was laminated on the upper and lower surfaces of the glass woven fabric of sample 1 and the glass woven fabrics impregnated with the unvulcanized fluoro rubber of samples 2 through 9. A material formed by the following method was used as the surface layer material: by using a 0.2 mm-thick glass cloth as a base material, the adhesive surface of the base material was coated with an adhesive of an unvulcanized fluoro rubber, and the front surface of the base material was coated with a polyimide resin. In this laminated state, a press was performed at a temperature of 180° C. and a pressure of 2 MPa for 60 minutes. The unvulcanized fluoro rubber impregnated in each woven fabric and the adhesive applied to the surface layer material were thus vulcanized. The hot press cushioning pad of samples 1 through 9 having an integrally laminated structure of the fiber-rubber composite material and the surface layers were thus obtained.

[Table 1]

Sample 10

Sample 10 is the same hot press cushioning pad as that of sample 2 except that a common woven fabric using no texturized yarn was used as a glass woven fabric. More specifically, a twilled glass woven fabric "A710" (made by Unitika Ltd.), which uses a 405-tex non-texturized doubled and twisted yarn of 2,400 E-glass fibers (fiber diameter: 9 μm) as the warp and the weft, was used as the woven fabric. This woven fabric had a weight of 708 g/cm², a thickness of 0.60 mm, and a void ratio of 53.5%.

A solution was prepared by dissolving an unvulcanized fluoro rubber having a solid concentration of 14.2% in a solvent prepared by mixing butyl acetate and methyl ethyl ketone at a mass ratio of 1:1. After immersed in the unvulcanized fluoro rubber solution, the glass woven fabric was squeezed with two rolls, and then sufficiently dried. The same surface layer material as that of sample 2 was then integrally laminated on the upper and lower surfaces of the glass woven fabric impregnated with the unvulcanized fluoro rubber, by the same method as that of sample 2. A hot press cushioning pad having an integrally laminated structure of the fiber-rubber composite material and the surface layers was thus obtained.

Sample 11

A needle punched nonwoven fabric formed by webs of a meta-aromatic polyamide fiber "Cornex" (made by Teijin Limited) having a thickness of 2 d and a fiber length of 51 mm was used as sample 11. This nonwoven fabric was produced as follows: an adhesive base cloth was formed by applying an unvulcanized fluoro rubber to a glass cloth with open texture, the web was laminated on both surfaces of the adhesive base cloth, and the resultant cloth was needle-punched. The nonwoven fabric thus obtained had a weight of 350 g/m², a thickness of 2.0 mm, and a void ratio of 87.3%. The same surface layer material as that of sample 2 was integrally laminated on both upper and lower surfaces of the nonwoven fabric by the same method as that of sample 2. A hot press cushioning pad having an integrally laminated structure of the needle-punched nonwoven fabric and the surface layers was thus obtained.

Comparative Test

Figure 9:
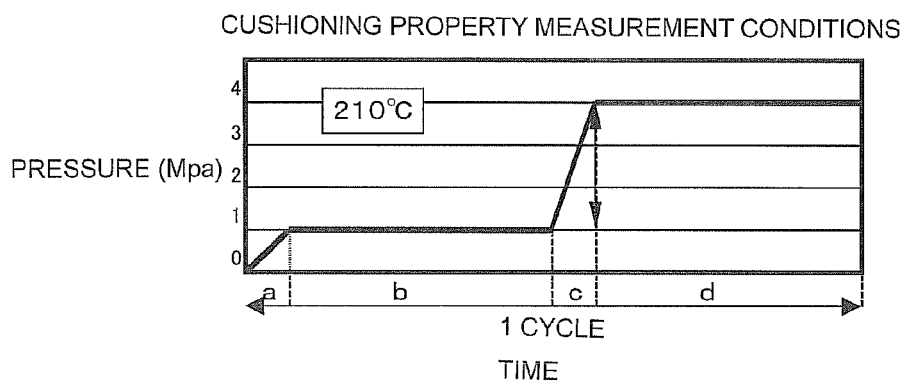
FIG. 9 is an illustration of cushioning-property measurement conditions.

A repetitive cushioning property of each sample was measured. Measurement conditions of the cushioning property will now be described with reference to FIG. 9. First, a sample was placed between hot platens at 210° C. and preheated for 2 minutes. The sample was then pressed from 0 MPa to 1 MPa at a compression rate of 1 mm/min (a). The sample was then held under the pressure of 1 MPa for 20 minutes (b). The pressure was then increased from 1 MPa to 4 MPa at a compression rate of 1 mm/min (c). The sample was then held under the pressure of 4 MPa for 20 minutes, and the pressure was released (d). (a)-(b)-(c)-(d) was used as one press cycle.

In this press cycle, the amount of reduction in thickness of the sample during the step (c), that is, while the pressure was increased from 1 MPa to 4 MPa, was used as an index of the cushioning property. This press cycle was repeated to measure how the cushioning property changed. The cushioning property of each sample after the first press, after the $10^{th}$ press, after the $50^{th}$ press, and after the $100^{th}$ press is shown in Table 2.

[Table 2]

Although the embodiment of the present invention has been described with reference to the figures, the present invention is not limited to the illustrated embodiment. Various modifications and variations can be made to the above illustrated embodiment within the same scope as, or an equivalent scope to, the present invention.

TABLE 1

| | GLASS WOVEN FABRIC | | | FLUORO RUBBER | | | TOTAL | |
|---|---|---|---|---|---|---|---|---|
| | WEIGHT (g/m2) | THICKNESS (mm) | VOLUME RATIO (%) | SOLID CONCENTRATION (%) | ADHESION AMOUNT (g/m2) | VOLUME RATIO (%) | RUBBER/FIBER VOLUME RATIO | VOID RATIO (%) |
| SAMPLE 1 | 850 | 1.02 | 32.8 | — | 0 | 0.0 | 0.00 | 67 |
| SAMPLE 2 | 850 | 1.02 | 32.8 | 14.2 | 20 | 0.9 | 0.03 | 66 |
| SAMPLE 3 | 850 | 1.02 | 32.8 | 14.2 | 45 | 2.0 | 0.06 | 65 |
| SAMPLE 4 | 850 | 1.02 | 32.8 | 14.2 | 75 | 3.3 | 0.10 | 64 |
| SAMPLE 5 | 850 | 1.02 | 32.8 | 14.2 | 105 | 4.6 | 0.14 | 63 |
| SAMPLE 6 | 850 | 1.02 | 32.8 | 14.2 | 140 | 6.2 | 0.19 | 61 |
| SAMPLE 7 | 850 | 1.02 | 32.8 | 28.4 | 228 | 10.1 | 0.31 | 57 |
| SAMPLE 8 | 850 | 1.02 | 32.8 | 28.4 | 350 | 15.5 | 0.47 | 52 |
| SAMPLE 9 | 850 | 1.02 | 32.8 | 35.5 | 450 | 19.9 | 0.61 | 47 |

TABLE 2

| | | CUSHIONING PROPERTY (μm) (VOID RATIO (%)) | | | | | | | | |
|---|---|---|---|---|---|---|---|---|---|---|
| | | 1ST PRESS | | 2ND PRESS | | 10TH PRESS | | 50TH PRESS | | 100TH PRESS |
| SAMPLE 1 | TEXTURIZED WOVEN FABRIC | 225 | (42.3) | 185 | (41.3) | 155 | (40.2) | FIBERS WERE BENT AND BROKEN | | |
| SAMPLE 2 | TEXTURIZED WOVEN FABRIC IMPREGNATED WITH RUBBER | 185 | (41.8) | 135 | (40.7) | 131 | (39.7) | FIBERS WERE BENT AND BROKEN | | |
| SAMPLE 3 | TEXTURIZED WOVEN FABRIC IMPREGNATED WITH RUBBER | 135 | (41.8) | 112 | (39.8) | 105 | (37.7) | 102 | (35.5) | 100 (33.0) |
| SAMPLE 4 | TEXTURIZED WOVEN FABRIC IMPREGNATED WITH RUBBER | 103 | (41.5) | 101 | (40.6) | 100 | (38.6) | 100 | (38.6) | 101 (36.5) |
| SAMPLE 5 | TEXTURIZED WOVEN FABRIC IMPREGNATED WITH RUBBER | 117 | (39.4) | 110 | (38.4) | 108 | (37.4) | 106 | (36.3) | 105 (34.1) |
| SAMPLE 6 | TEXTURIZED WOVEN FABRIC IMPREGNATED WITH RUBBER | 114 | (35.9) | 106 | (34.8) | 103 | (33.7) | 102 | (31.4) | 102 (30.2) |
| SAMPLE 7 | TEXTURIZED WOVEN FABRIC IMPREGNATED WITH RUBBER | 115 | (33.7) | 108 | (31.7) | 102 | (30.6) | 101 | (29.5) | 100 (27.1) |
| SAMPLE 8 | TEXTURIZED WOVEN FABRIC IMPREGNATED WITH RUBBER | 92 | (27.6) | 76 | (24.3) | 68 | (21.9) | 62 | (19.3) | 55 (17.9) |
| SAMPLE 9 | TEXTURIZED WOVEN FABRIC IMPREGNATED WITH RUBBER | 73 | (23.2) | 56 | (18.6) | 50 | (16.0) | 51 | (13.3) | 48 (11.9) |
| SAMPLE 10 | NON-TEXTURIZED WOVEN FABRIC IMPREGNATED WITH RUBBER | 35 | (—) | 30 | (—) | 25 | (—) | 26 | (—) | 24 (—) |
| SAMPLE 11 | NONWOVEN FABRIC | 178 | (79.8) | 95 | (70.8) | 68 | (67.6) | 57 | (64.0) | 46 (59.0) |

The invention claimed is:

1. A cushioning pad, in the form of a flat plate and having sufficient in-plane uniformity, heat transfer, dimensional stability, and durability to hot press a plate-shaped laminate by being interposed between the plate-shaped laminate and a heating platen, the cushioning pad comprising:
    a fiber-rubber composite material layer formed by a woven fabric and a rubber impregnated in said woven fabric, wherein
    said woven fabric comprising a texturized yarn made of glass fibers as at least one of warp and weft, said fiber-rubber composite material layer has voids inside,
    said texturized yarn has a large occupied area in which short fibers forming the glass yarn are not in parallel with each other but are tangled, and are arranged in a disordered state,
    a volume ratio of said rubber to fibers of said woven fabric in said fiber-rubber composite material layer is 5 to 50%, and
    wherein a void ratio of said fiber-rubber composite material layer is 20 to 65%, and wherein the voids are not completely filled and blocked by the rubber.

2. The cushioning pad according to claim 1, wherein the volume ratio of said rubber to fibers of said woven fabric in said fiber-rubber composite material layer is 5 to 35%.

3. The cushioning pad according to claim 1, wherein said texturized yarn is used as both said warp and said weft.

4. The cushioning pad according to claim 1, wherein said woven fabric is a single-weave or multiple-weave woven fabric.

5. The cushioning pad according to claim 1, wherein said texturized yarn is a bulked yarn.

6. The cushioning pad according to claim 1, wherein said rubber is a material selected from the group consisting of a fluoro rubber, an EPM, an EPDM, a hydrogenated nitrile rubber, a silicone rubber, an acrylic rubber, a butyl rubber, and a combination thereof.

7. The cushioning pad according to claim 1, wherein said cushioning pad is formed by integrally laminating at least one layer of said fiber-rubber composite material layer and at least one layer of a material selected from the group consisting of a woven fabric, a nonwoven fabric, paper, a film, a foil, a sheet, and a plate.

8. The cushioning pad according to claim 1, wherein said composite material layer is 0.5-1.02 mm in thickness.

9. The cushioning pad according to claim 1, wherein a void ratio of said fiber-rubber composite material layer is 23.2 to 42.3% after hot press once.

10. The cushioning pad according to claim 1, wherein a void ratio of said fiber-rubber composite material layer is 18.6 to 41.3% after hot press twice.

11. The cushioning pad according to claim 1, wherein a void ratio of said fiber-rubber composite material layer is 16.0 to 40.2% after hot press ten times.

12. The cushioning pad according to claim 1, wherein a void ratio of said fiber-rubber composite material layer is 13.3 to 38.6% after hot press fifty times.

13. The cushioning pad according to claim 1, wherein a void ratio of said fiber-rubber composite material layer is 11.9 to 36.5% after hot press one hundred times.

14. The cushioning pad according to claim 1, further comprising a mold release layer over opposite surfaces thereof.

15. The cushioning pad according to claim 1, wherein said woven fabric comprises both warp glass fibers and weft glass fibers.

16. The cushioning pad according to claim 1, wherein said woven fabric comprises weft bulked glass yarn and warp normal glass fiber yarn or weft normal glass fiber yarn and warp bulked glass fiber yarn.

17. The cushioning pad according to claim 1, wherein said texturized yarn is selected from the group consisting of a bulked yarn, a staple yarn, and a silver yarn.

18. A method for manufacturing the cushioning pad according to claim 1, the method comprising the steps of:
    preparing a woven fabric using a texturized yarn made of glass fibers as at least one of warp and weft;
    penetrating said woven fabric with an unvulcanized rubber solution;
    drying said unvulcanized rubber solution penetrated in said woven fabric; and
    vulcanizing said dried unvulcanized rubber.

19. A method for manufacturing the cushioning pad according to claim 1, the method comprising:
    providing a cushioning pad including a fiber-rubber composite material layer formed by a woven fabric and a rubber impregnated in said woven fabric, wherein said woven fabric comprises a texturized yarn made of glass fibers as at least one of warp and weft, said fiber-rubber composite material layer has voids inside; and
    hot-pressing a plate-shaped laminate interposed between the cushioning pad and a heating platen.

20. The method according to claim 19, wherein said composite material layer is 0.5 -1.02 mm in thickness.

21. The method according to claim 19, wherein a void ratio of said fiber-rubber composite material layer is 13.3 to 38.6% after hot press fifty times.

22. The method according to claim 19, wherein a void ratio of said fiber-rubber composite material layer is 11.9 to 36.5% after hot press one hundred times.

* * * * *

UNITED STATES PATENT AND TRADEMARK OFFICE
CERTIFICATE OF CORRECTION

PATENT NO. : 8,435,630 B2
APPLICATION NO. : 12/515613
DATED : May 7, 2013
INVENTOR(S) : Akira Yoshida It is certified that error appears in the above-identified patent and that said Letters Patent is hereby corrected as shown below:

In the Claims

Column 12, line 22, "a silver yarn." should read --a sliver yarn.--.

Column 12, lines 41 - 42, "hot-pressing a plate-shaped laminate interposed between the cushioning pad and a heating platen." should read --hot-pressing a plate-shaped laminate by interposing the cushioning pad between the plate-shaped laminate and a heating platen.--.

Signed and Sealed this
Twenty-fourth Day of June, 2014

Michelle K. Lee
*Deputy Director of the United States Patent and Trademark Office*